United States Patent
Nicholson

(10) Patent No.: US 11,012,033 B1
(45) Date of Patent: May 18, 2021

(54) OSCILLATOR WITH ONE-PORT RESONATOR

(71) Applicant: Keysight Technologies, Inc., Santa Rosa, CA (US)

(72) Inventor: Dean Nicholson, Windsor, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/667,546

(22) Filed: Oct. 29, 2019

(51) Int. Cl.
*H03B 5/30* (2006.01)
*H03B 5/24* (2006.01)
*H03B 5/12* (2006.01)

(52) U.S. Cl.
CPC .......... *H03B 5/30* (2013.01); *H03B 5/12* (2013.01); *H03B 5/24* (2013.01); *H03B 2200/009* (2013.01)

(58) Field of Classification Search
CPC ... H03B 5/12; H03B 5/24; H03B 5/30; H03B 2200/009
See application file for complete search history.

(56) References Cited

U.S. PATENT DOCUMENTS

| 5,036,299 A | 7/1991 | Dick et al. |
| 7,075,378 B2 | 7/2006 | Howe et al. |
| 2020/0153410 A1* | 5/2020 | Nielsen .................. H03H 9/545 |

OTHER PUBLICATIONS

R.A. Woode et al., "An Ultra-Low Noise Microwave Oscillator Based on a High-Q Liquid Nitrogen Cooled Saphire Resonator", 1995 IEEE International Frequency Control Symposium, pp. 420-426.
G. J. Dick et al., "Ultra-Low Noise Microwave Phase Stabilizer Using Sapphire Ring Resonator", Forty-Fourth Annual Symposium on Frequency Control, 1990 IEEE Conference, pp. 577-584.

* cited by examiner

*Primary Examiner* — Jeffrey M Shin

(57) ABSTRACT

An oscillator generates a radio frequency (RF) output signal having high phase shift versus frequency characteristics close to a desired output frequency of the oscillator. The oscillator includes a resonator having a resonant frequency that is substantially the same as the desired output frequency of the oscillator, where the resonator provides a reflected signal; a resistor connected to one port of the resonator, another port of the resonator being connected to ground; an amplifier configured to receive the reflected signal from the resonator and to output an amplified reflected signal as the RF output signal; and a circulator having a first port connected to the resonator via the resistor, a second port connected to an input of the amplifier, and a third port connected to an output of the amplifier such that the amplified reflected signal is input back to the resonator.

20 Claims, 5 Drawing Sheets

OSCILLATOR WITH ONE-PORT RESONATOR

BACKGROUND

Microwave oscillators are used to generate radio frequency (RF) signals. A microwave oscillator includes a resonator that provides a signal at its resonant frequency, which corresponds to the output frequency of the generated RF signal. Generally, the resonator has a magnitude response and a phase response, where the magnitude response may be indicated by insertion loss as a function of the resonator frequency and a phase response may be indicated by phase shift as a function of frequency. For various uses, it is desirable for the microwave oscillator to provide an RF signal with high phase shift versus frequency characteristics, particularly at frequencies close to the desired output carrier frequency. For example, for resonators having a high quality factor (Q), such as quartz crystal resonators, this high phase shift region enables the phase shift to reach ±45 degrees of phase shift within <0.01% of the resonator's center frequency. For other resonators having a lower Q, such as varactor tuned resonators, the ±45 degree phase shift points may be as high as ±1.0% of the center frequency.

Generally, for any resonator, it is desirable to have ±45 degree phase shift points as close as possible to the center frequency (f), as these are the points where the phase noise is down to within 3 dB of the phase noise floor, assuming there are no 1/f noise generators in the oscillator loop. As you get closer to the center frequency from the ±45 degree points, the phase noise increases at 20 dB/decade of offset frequency until the 1/f noise generation becomes a factor, and then the phase noise increases at 30 dB/decade of offset frequency as you get closer to the center frequency.

However, conventional oscillators that provide high phase shift characteristics versus frequency characteristics still have higher phase noise than desired near the carrier frequency in many cases. An example application in which lower phase noise is always desired is radar, where phase noise of the radar signal may mask the reflection from a small object, leading to poor performance. Thus, improved phase noise is always desired.

Conventional microwave oscillators include resonators having either a two-port configuration or a one-port configuration. FIG. 1 is a simplified block diagram showing a microwave oscillator with a resonator having the two-port configuration. The oscillator 100 includes a resonator 110, an amplifier 120, and a coupler 130. The resonator 110 is connected to the other components of the oscillator circuit through two ports, a first (output) port connected to the amplifier 120 and a second (input) port connected to the coupler 130. Use of the two ports enables a feedback loop that returns the amplified resonated signal to the resonator 110. The coupler 130 is configured to couple at least a portion of the amplified resonated signal to the RF output, indicated by output load resistor 140. FIG. 2 is a simplified block diagram showing a microwave oscillator with a resonator having the one-port configuration. The oscillator 200 includes a resonator 210, an amplifier 220, and a coupler 230. The resonator 210 has just one port, which is connected to the coupler 230 and the amplifier 220 via the coupler 230. The coupler 230 is configured to couple at least a portion of the signal from the resonator after it has been amplified to the RF output, indicated by output load resistor 240. The advantage of the one-port resonator 210 over the two-port resonator 110 is that the line length between the resonator and the amplifier can be kept very short, allowing a wideband tunable oscillator to be built, such as a yttrium iron garnet (YIG) tuned oscillator for example (which may have continuous tuning from 6 GHz to 20 GHz).

One example of a one-port resonator configuration for a microwave oscillator is described in U.S. Pat. No. 5,236,299 to Dick et al. (Jul. 30, 1991). The '299 patent describes, in part, a microwave oscillator that includes a one-port resonator and a circulator, to which the one port of the resonator is connected via a coupler to provide an oscillator loop. The oscillator loop is intended to enable feedback to the resonator, as in a two-port solution, but using a one-port resonator, and configured in such a way as to provide a higher phase shift versus frequency than could be achieved using the same resonator in a two-port configuration. However, the oscillator with the one-port resonator connected to the circulator, as shown in FIG. 3 of the '299 patent, in particular, was modeled by the present inventor using Advanced Design System (ADS), available from Keysight Technologies, Inc., in an attempt to determine viability. The modeling showed unstable operation of the microwave oscillator whenever the carrier (i.e., the center frequency of oscillation) was at a lower magnitude than the out-of-band (i.e., high offset from the center frequency) response when the oscillator loop was opened and the gain around the oscillator loop was measured. This lower magnitude at the center frequency may be referred to as carrier suppression. With unstable operation of the oscillator, the phase noise is undefined, and the oscillator is unusable. Such unusable oscillator with the one-port resonator described by the '299 patent would not provide the asserted improvement in phase noise (e.g., 20 dB).

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
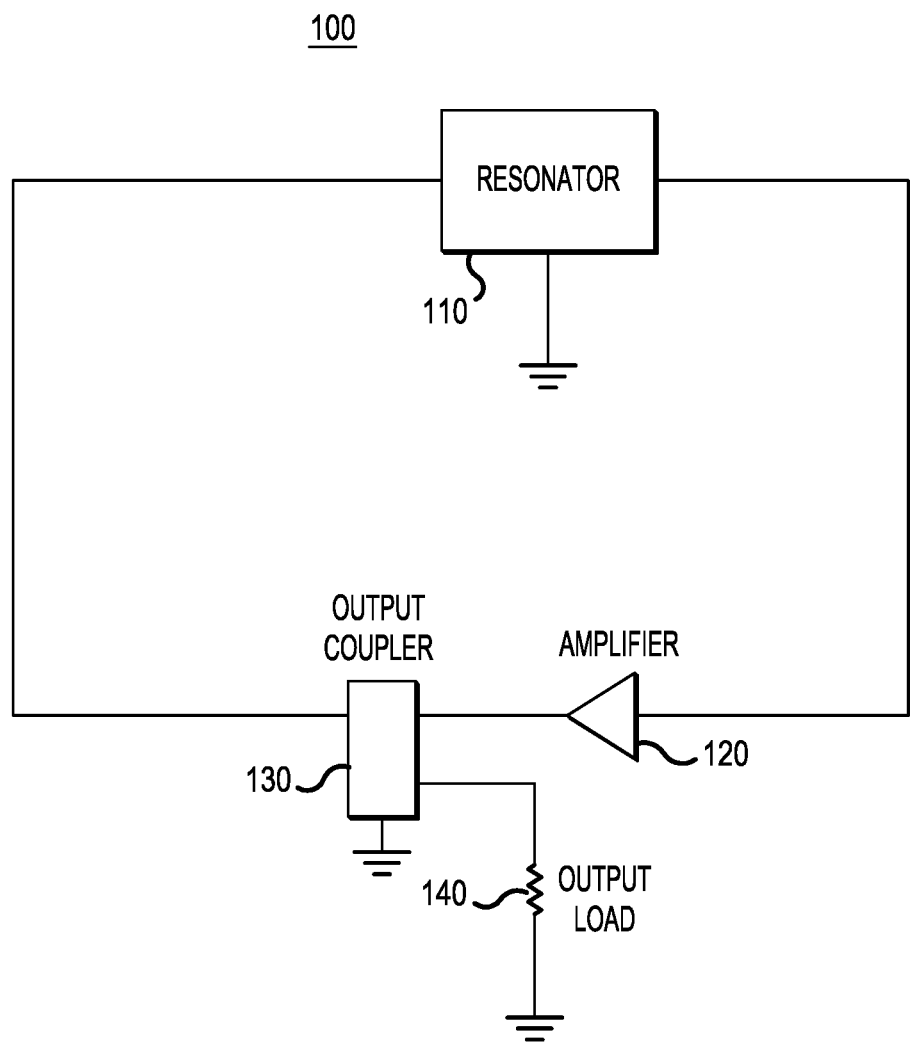
FIG. 1 is a simplified block diagram of a conventional microwave oscillator for generating a radio frequency (RF) output signal, having a two-port resonator configuration.
Figure 2:
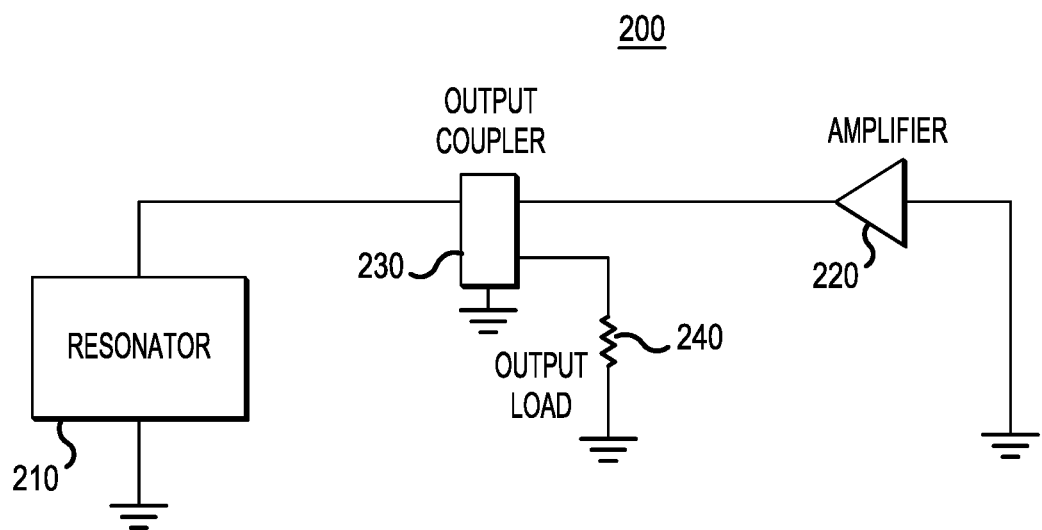
FIG. 2 is a simplified block diagram of a conventional microwave oscillator for generating an RF output signal, having a one-port resonator configuration.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a", "an" and "the" are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Generally, according to various embodiments, a microwave oscillator includes a one-port resonator that is indirectly connected to a circulator through a resistance, to provide a reflected signal that is amplified and coupled to an output of the microwave oscillator as an RF output signal. The configuration improves the magnitude and phase responses of the RF output signal, while providing out-of-band stability.

Figure 3:
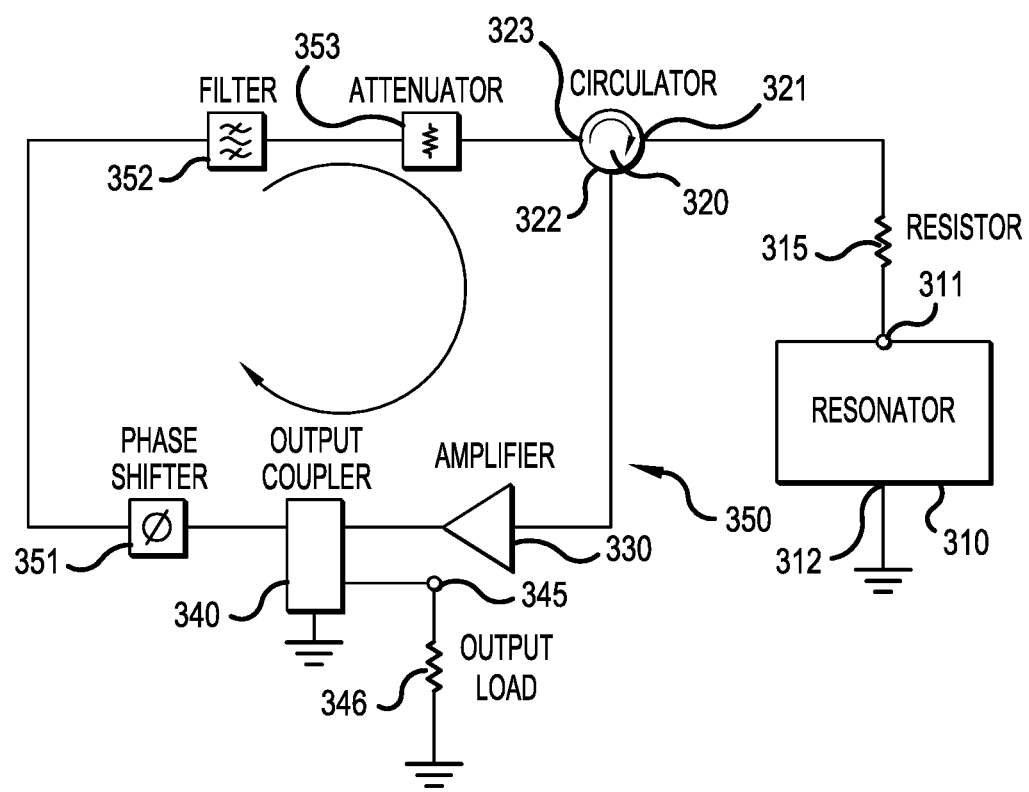
FIG. 3 is a simplified block diagram of a microwave oscillator for generating an RF output signal, according to a representative embodiment

FIG. 3 is a simplified block diagram of a microwave oscillator for generating an RF output signal, according to a representative embodiment.

Referring to FIG. 3, an oscillator 300 generates an RF output signal at a desired output (carrier) frequency $f_{out}$. The oscillator 300 is configured such that the generated RF output signal has high phase shift versus frequency characteristics at frequencies within ±45 degrees of phase shift from the center frequency of resonator 310, which is also the desired output frequency $f_{out}$. The 45 degree phase shift points of the RF output signal occur at frequencies offset from the carrier of the RF output signal that is less than the frequency offsets of a conventional oscillator, as discussed below with reference to FIGS. 5A and 5B. That is, the 45 degree phase shift points of the RF output signal are closer to the desired output frequency $f_{out}$ than for conventional oscillators. The frequencies of the RF output signal that are close to the desired output frequency $f_{out}$ (within the 45 degree phase shift points) may be referred to as in-band frequencies of the oscillator 300, and all other frequencies of the RF output signal may be referred to as out-of-band frequencies.

In the depicted embodiment, the oscillator 300 includes the resonator 310, a circulator 320, and a resistor 315 that is connected in series between the resonator 310 and the circulator 320. The resonator 310 has a resonant frequency $f_{res}$ (center of resonance or center frequency), and is configured to provide a reflected signal (resonator output signal) to a first port 321 of the circulator 320 via the resistor 315 in response to a stimulus signal received from the first port 321. The stimulus signal is a superposition of the reflected signal and an amplified reflected signal input to the circulator 320 through a feedback oscillator loop 350, which is connected between the resistor 315 and an output 345 of the oscillator 300, discussed below. The resonant frequency $f_{res}$ of the resonator 310 is substantially the same as the desired RF output frequency $f_{out}$ of the oscillator 300. The resonator 310 has a one-port configuration, in which a port 311 is connected to the resistor 315, which inputs the stimulus signal and outputs the reflected signal. The resonator 310 is also connected to ground at a ground connection 312.

In various embodiments, the resonator 310 is configured to act as a parallel resistor-inductor-capacitor (RLC) resonator circuit, for example. Various types of resonators act as parallel RLC resonator circuits, from a circuit modeling perspective, including an LC resonator that includes an inductor and capacitor connected in parallel with one another, and a resistor added to the model in parallel with the inductor and capacitor to compensate for electrical losses of the inductor and capacitor. Other examples of resonators that can effectively function as and/or be modelled by a parallel RLC resonator circuit include a dielectric resonator, a transmission line resonator, a spherical yttrium iron garnet (YIG) resonator, a magnetically tunable material resonator, and a sapphire resonator, as would be apparent to one of ordinary skill in the art. Alternatively, the resonator 310 may be a quartz crystal resonator, in which case a ¼ wavelength transmission line (not shown) would be connected in series between the resonator 310 and the resistor 315. Notably, the combination of the quartz crystal resonator and the ¼ wavelength transmission line would likewise effectively function as and/or be modeled by a parallel RLC resonator circuit, as would be apparent to one of ordinary skill in the art. The resonator 310 may be a high-Q resonator, for example.

The oscillator 300 further includes an amplifier 330 and a coupler 340 connected between a second port 322 and a third port 323 of the circulator 320. Thus, the oscillator loop 350 includes the circulator 320, the amplifier 330, and the coupler 340. The amplifier 330 has an input connected to the second port 322 of the circulator 320 for receiving the reflected signal, and an output connected (e.g., indirectly through the coupler 340) to the third port 323 of the circulator 320 for outputting an amplified reflected signal corresponding to the reflected signal. The amplified reflected signal is input back to the resonator 310 via the circulator 320 and the resistor 315 as the stimulus signal, forming the oscillator loop 350. The coupler 340 is connected to the output of the amplifier 330, and is configured to couple at least a portion of the amplified reflected signal to the output 345 of the oscillator 300 as the RF output signal. The coupler 340, together with the amplifier 330, optimizes power and phase noise of the RF output signal. The coupler 340 may be a directional coupler, for example, in order to minimize effects on performance of the oscillator 300 caused by unwanted reflections from the resonator 310. An illustrative output load is indicated by output load resistor 346. Generally, the coupler 340 may couple the amplified reflected signal to the output 345 of the oscillator 300.

The oscillator 300 may also include additional (optional) circuitry for optimizing functionality of the oscillator loop 350, and thus the oscillator 300. For example, FIG. 3 depicts a phase shifter 351, a filter 352, and an attenuator 353 connected in series between the amplifier 330 and the circulator 320 in the oscillator loop 350. The phase shifter 351 is configured to adjust the phase of the amplified reflected signal in order to match the phase of the reflected signal at the circulator 320. That is, the phase shifter 351 adjusts the phase of the amplified reflected signal such that a phase shift of a round trip signal in the oscillator loop 350 is zero degrees. The phase shifter 351 may be implemented using a length of transmission line, a high pass filter, or a low pass filter, for example. The filter 352 is configured to pass portions of the amplified reflected signal within a predetermined frequency range, and to improve signal-to-noise ratio, generally. The filter 352 may be implemented using a bandpass filter, for example. The attenuator 353 is configured to optimize the gain around the oscillator loop 350 so that the amplifier 330 is in the right amount of compression to provide the best phase noise.

With regard to the resistor 315, a resistance value is selected such that the signal strength of the reflected signal (and thus the RF output signal) at the resonant frequency is greater than the signal strengths of the reflected signal at other frequencies, which tends to make the oscillator 300 more likely to oscillate at the desired output frequency (where the phase shift is zero). The resistance value of the resistor 315 may be determined empirically, or by using circuit modeling, for example. Generally, as the resistance value of the resistor 315 increases, losses at the out-of-band frequencies of the reflected signal increase, and losses at the in-band frequencies (within the 45 degree phase shift points of the resonant frequency or the desired center frequency) of the amplified reflected signal decrease. Once the out-of-band losses are larger than the losses at the resonant frequency (center of resonance), and the amplifier 330 has insufficient gain to overcome the losses at the out-of-band frequencies, such that out-of-band spurious oscillations are not supported, the amplified reflected signal will oscillate at the desired resonant (center) frequency in a stable manner.

Also, the resistor 315 and the resonator 310 suppress the amplitude of the out-of-band frequencies of the amplified reflected signal as compared to amplitude of the amplified reflected signal at the desired center frequency. For example, the out-of-band frequencies of the amplified reflected signal may be suppressed by more than about 3.5 dB, improving quality of the RF output signal at the desired center frequency, as well as the in-band frequencies. For example, at an optimal value, the resistor 315 may approximately double a loaded Q of the resonator 310. Notably, at a critical resistance value of the resistor 315, the amplitude response of the resonator 310 is flat versus frequency, even though there is still significant phase shift versus frequency, as discussed below. Conventional oscillators with the one-port resonator configuration do not include a resistor, such as the resistor 315, for improving functionality and stability.

Figure 4B:
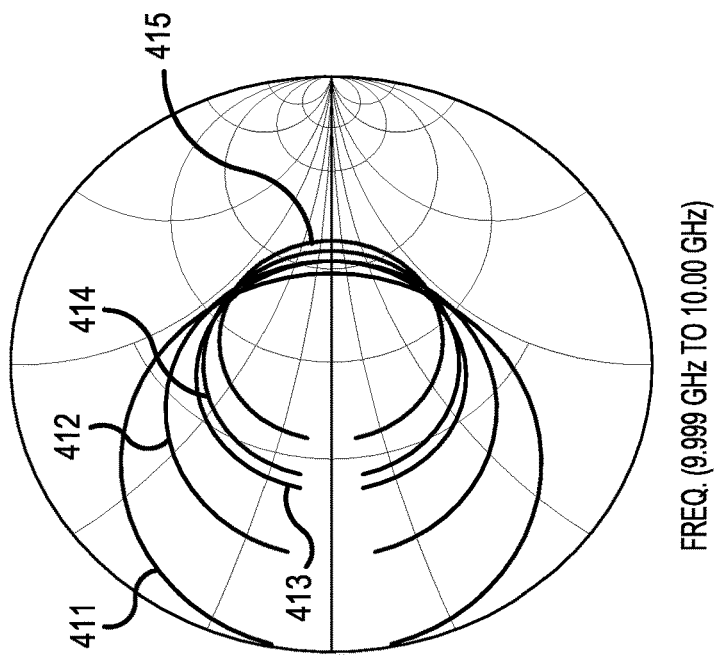
FIG. 4B is a Smith Chart showing impedance as a function of frequency of an RF output signal from the oscillator corresponding to different resistance values of the resistor, according to a representative embodiment.
Figure 4A:
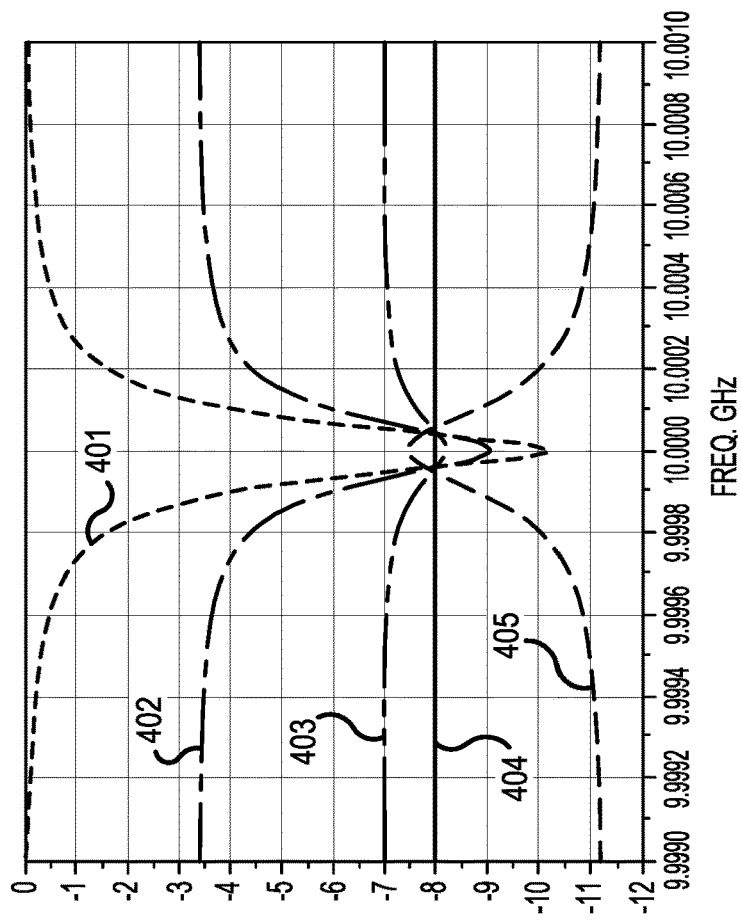
FIG. 4A is an insertion loss performance plot showing amplitude as a function of frequency of an RF output signal from an oscillator corresponding to different resistance values of a resistor, according to a representative embodiment.

FIG. 4A is an insertion loss performance plot showing magnitude response as a function of frequency of an RF output signal from the oscillator 300 corresponding to different resistance values of the resistor 315, according to a representative embodiment. FIG. 4B is a Smith Chart showing impedance as a function of frequency of an RF output signal from the oscillator 300 corresponding to different resistance values of the resistor 315, according to a representative embodiment.

Referring to FIG. 4A, the magnitude (amplitude) of each of the RF output signals is indicated by S-parameter $S_{11}$ (reflection coefficient), determined at the first port 321 of the circulator 320. Also, the desired center frequency of the oscillator 300 is assumed to be 10 GHZ, for purposes of explanation. Trace 401 shows insertion loss of the oscillator 300 when the resistance value of the resistor 315 is zero, which is the same as having no resistor (as in the case of conventional oscillators). Trace 402 shows insertion loss of the oscillator 300 when the resistance value of the resistor 315 is 2.5 Ohms; trace 403 shows insertion loss of the oscillator 300 when the resistance value of the resistor 315 is 5.0 Ohms; trace 404 shows insertion loss of the oscillator 300 when the resistance value of the resistor 315 is 5.642 Ohms; and trace 405 shows insertion loss of the oscillator 300 when the resistance value of the resistor 315 is 7.5 Ohms. Traces 401-403 show suppressed center frequencies (carriers) of the oscillator 300 in that the loss at the center frequency exceeds the losses at frequencies other than the center frequency (e.g., out-of-band frequencies). In comparison, trace 404 shows a flat magnitude response, and trace 405 shows less loss at the center frequency than at frequencies other than the center frequency. Trace 405 depicts the desired scenario for most implementations.

In particular, trace 401 shows a maximum value of the S-parameter $S_{11}$ of about 0 dB, which is the same as a minimum insertion loss of about 0 dB at ±1 MHz (highest offset out-of-band frequencies), and a minimum value of the S-parameter $S_{11}$ of about −10 dB, which is the same as a maximum insertion loss of about 10 dB at 10 GHz (center frequency). (Generally, the insertion loss is the negative of the value of the S-parameter $S_{11}$.) Thus, trace 402 shows a minimum insertion loss of about 3.5 dB at ±1 MHz, and a maximum insertion loss of about 9.0 dB at 10 GHz, and trace 403 shows a minimum insertion loss of about 7.0 dB at ±1 MHz, and a maximum insertion loss of about 8.2 dB at 10 GHz. The insertion loss is flat at about 8.0 dB, as shown by trace 404. Trace 405 shows the relative values of the insertion losses flipping, where a minimum insertion loss of about 7.5 dB occurs at the center frequency of 10 GHz, and a maximum insertion loss of about 11.2 dB occurs at ±1 MHz. Accordingly, using a resistance value of 7.5 Ohm for the resistor 315 provides the best results for the oscillator 300 having a center frequency of 10 GHz. In the depicted example, the oscillator 300 with the 7.5 ohm resistor 315 in series with the resonator 310 suppresses amplitude at the out-of-band frequencies as compared to amplitude at the center frequency (center of resonance) of 10 GHZ by more than about 3.5 dB.

Referring to FIG. 4B, the desired center frequency of the oscillator 300 is still assumed to be 10 GHZ. Trace 411 on the Smith Chart corresponds to trace 401 on the magnitude response plot, above (for the same resistor value). Likewise, trace 412 on the Smith Chart corresponds to trace 402, trace 413 on the Smith Chart corresponds to trace 403, trace 414 on the Smith Chart corresponds to trace 404, and trace 415 on the Smith Chart corresponds to trace 405. At center frequency of resonance, which corresponds to the farthest right hand point of the trace which lies on the x axis, each of the traces 411 to 415 is much nearer the center of the Smith Chart than the outer edge of the Smith Chart, showing a lossy reflection, although the trace 415 at resonance shows the least lossy reflection of the traces 411 to 415. At high off-resonance frequencies, each of the traces 411 to 413 is nearer the edge of the Smith Chart, showing a high value reflection with little loss, while each of the traces 414 and 415 shows reflection values that are the same as or lower than those at resonance, respectively.

Thus, the configuration of the oscillator 300 provides for stable operation, approximately doubling phase shift versus frequency around the oscillator loop in open loop configuration (which leads to lower oscillator phase noise in the closed loop condition). Open loop condition means that there is no connection to complete the oscillator loop. For example, in FIG. 1, when the connection between the output of the resonator 110 and the input of the amplifier 120 is removed, then the oscillator 100 would be in the open loop configuration, and its performance may be characterized by inputting a signal to the input of the amplifier 120 and measuring the signal at the output of the resonator 110. Similarly, in FIG. 3, when the connection between the output of the circulator 320 (the second port 322) and the input of the amplifier 330 is removed, then the oscillator 300 would be in the open loop configuration, and its performance may be characterized by injecting a signal into the input of amplifier 330 and measuring the signal at the second port 322 of the circulator 320.

Figure 5B:
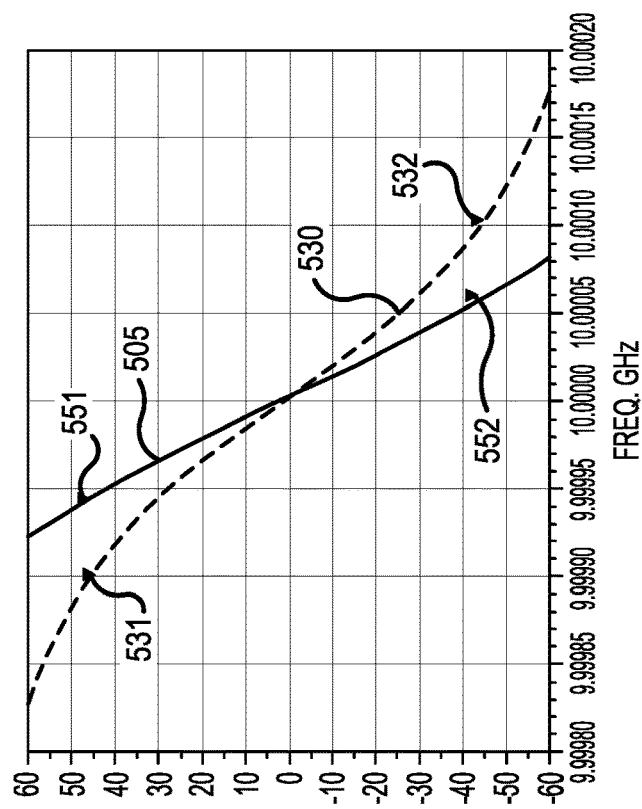
FIG. 5B is a graph showing a magnified portion of the phase responses of FIG. 5A, where the magnified portion is between the 45 degree phase shift points of the RF output signals.
Figure 5A:
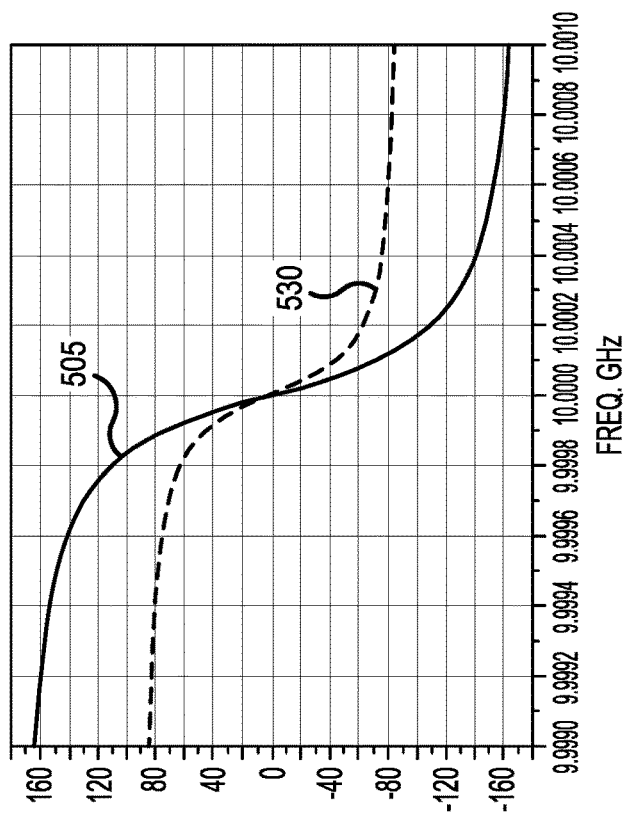
FIG. 5A is a graph showing phase response of an RF output signal from an oscillator in open loop configuration, according to a representative embodiment, and phase response of an RF output signal from a conventional two-port oscillator in open loop configuration.

FIG. 5A is a graph showing phase response of an RF output signal from an oscillator in open loop configuration, according to a representative embodiment, and phase response of an RF output signal from a conventional two-port oscillator in open loop configuration, for purposes of comparison. FIG. 5B is a graph showing a magnified portion of the phase responses of FIG. 5A, where the magnified portion is between the 45 degree phase shift points of the RF output signals.

Referring to FIG. 5A, trace 505 shows phase as a function of frequency of the RF output signal from the oscillator 300 in an open loop configuration, where a center frequency of the oscillator 300 is assumed to have a 10 GHz center frequency, and the resistor value of the resistor 315 is assumed to be 7.5 Ohms, for purposes of illustration. In other words, trace 505 corresponds to trace 405 in FIG. 4A. Trace 530 shows phase as a function of frequency of an RF output signal from a conventional oscillator in open loop configuration with a two-port resonator, also assumed to have a 10 GHz center frequency, with no resistor connected in series with the resonator. The phase of the RF output signal shown by trace 505 is indicated by S-parameter $S_{11}$ for a one-port oscillator, and the phase of the RF output signal shown by trace 530 is indicated by S-parameter $S_{21}$ for a two-port oscillator.

Trace 505 shows much higher phase shift versus frequency characteristics than trace 530. That is, trace 505 shows a phase shift of ±160 degrees at ±1 MHz from the center frequency, as compared to a phase shift of only ±82 degrees at ±1 MHz from the center frequency shown by trace 530.

In addition, referring to FIG. 5B, the frequency difference between the ±45 degree phase shift points is smaller for the oscillator 300, as shown by the magnified portion of trace 505. As stated above, the ±45 degree phase shift points indicate where the phase noise is down to within about 3 dB of the oscillator phase noise floor, neglecting the effects of 1/f noise, where f is the center frequency. On trace 505, corresponding to the oscillator 300 with the 7.5 Ohm resistor 315, the −45 degree phase shift point 551 is about 9.999944 GHZ and the +45 degree phase shift point 552 is about 10.000057 GHZ for a difference of about 113 kHz. On trace 530, corresponding to the conventional oscillator with the two-port resonator, the −45 degree phase shift point 531 is about 9.999905 GHZ and the +45 degree phase shift point 532 is about 10.000010 GHZ for a difference of about 195 kHz. Accordingly, the oscillator 300 with the resistor 315 has very stable operation with an effective loaded Q (QL) that is about 1.72 (195 kHz/113 kHz) times greater than that of the conventional two-port circuit. When there is a flat amplitude response versus frequency, e.g., when the resistor 315 has a resistor value of 5.642 Ohms, as discussed above, the oscillator 300 is just on the edge of stable operation at the center of resonance with an effective QL that is about 2 times greater than that of the conventional oscillator with a two-port resonator.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. An oscillator for generating a radio frequency (RF) output signal having high phase shift versus frequency characteristics close to a desired output frequency of the oscillator, the oscillator comprising:
a resonator having a resonant frequency that is substantially the same as the desired output frequency of the oscillator, wherein the resonator provides a reflected signal;
a resistor connected to one port of the resonator, another port of the resonator being connected to ground;
an amplifier configured to receive the reflected signal from the resonator and to output an amplified reflected signal as the RF output signal; and
a circulator having a first port connected to the resonator via the resistor, a second port connected to an input of the amplifier, and a third port connected to an output of the amplifier such that the amplified reflected signal is input back to the resonator.

2. The oscillator of claim 1, wherein the resonator is modelled as a parallel RLC resonator circuit.

3. The oscillator of claim 2, wherein the resonator comprises an RLC resonator, a dielectric resonator, a transmission line resonator, a spherical yttrium iron garnet (YIG) resonator, a magnetically tunable material resonator, or a sapphire resonator.

4. The oscillator of claim 2, further comprising a ¼ wavelength transmission line connected in series between the resonator and the resistor, wherein the resonator comprises a quartz crystal resonator.

5. The oscillator of claim 1, further comprising:
a coupler connected to the output of the amplifier, and configured to couple at least a portion of the amplified reflected signal from the resonator to an output of the oscillator as the RF output signal, optimizing power and phase noise of the RF output signal.

6. The oscillator of claim 5, wherein the coupler is a directional coupler, which minimizes effects on performance of unwanted reflections from the resonator.

7. The oscillator of claim 5, further comprising:
a phase shifter configured to adjust phase of the amplified reflected signal in an oscillator loop such that a phase shift of a round trip signal in the oscillator loop is zero degrees, wherein the oscillator loop comprises the circulator, the amplifier, the coupler, and the phase shifter.

8. The oscillator of claim 7, wherein the phase shifter comprises a length of transmission line.

9. The oscillator of claim 1, wherein as a resistance value of the resistor increases, losses at out-of-band frequencies of the amplified reflected signal increase, and losses at frequencies close to the resonant frequency of the amplified reflected signal decrease.

10. The oscillator of claim 9, wherein the amplifier has insufficient gain to overcome the losses at the out-of-band frequencies, such that out-of-band spurious oscillations are not supported, enabling the amplified reflected signal from the resonator to oscillate at the resonant frequency.

11. The oscillator of claim 9, wherein the resistor and the resonator suppress amplitude of the out-of-band frequencies of the amplified reflected signal by more than about 3.5 dB compared to amplitude of the amplified reflected signal at the resonant frequency.

12. The oscillator of claim 5, wherein the amplified reflected signal has a phase shift of zero degrees around an oscillator loop when operated at the resonant frequency, the oscillator loop comprising the circulator, the amplifier and the coupler.

13. The oscillator of claim 1, wherein the resonator comprises a high-Q resonator, and the resistor is connected in series with the high-Q resonator.

14. The oscillator of claim 1, wherein the resistor approximately doubles a loaded Q of the resonator.

15. An oscillator for generating a radio frequency (RF) output signal having high phase shift versus frequency characteristics close to a desired output frequency of the oscillator, the oscillator comprising:
a resonator having a resonant frequency that is substantially the same as the desired output frequency of the oscillator, wherein the resonator is modeled as a parallel RLC resonator circuit and provides a reflected signal;
a resistor connected in series to the resonator;
an output configured to output the RF output signal; and
an oscillator loop connected between the resistor and the output, the oscillator loop comprising:
a circulator having a first port connected to the resonator via the resistor to receive the reflected signal, a second port, and a third port;
an amplifier having an input, connected to the second port of the circulator, to receive the reflected signal and an output, connected to the third port of the circulator, to output an amplified reflected signal, which is input back to the resonator via the circulator; and
a coupler connected to the output of the amplifier, and configured to couple at least a portion of the amplified reflected signal to the output of the oscillator as the RF output signal.

16. The oscillator of claim 15, wherein the oscillator loop further comprises:
a phase shifter configured to adjust phase of the amplified reflected signal in the oscillator loop such that a phase shift of a round trip signal in the oscillator loop is zero degrees.

17. The oscillator of claim 15, wherein the resonator comprises an RLC resonator, a dielectric resonator, a transmission line resonator, a spherical yttrium iron garnet (YIG) resonator, a magnetically tunable material resonator, or a sapphire resonator.

18. The oscillator of claim 15, further comprising a ¼ wavelength transmission line connected in series between the resonator and the resistor, wherein the resonator comprises a quartz crystal resonator.

19. The oscillator of claim 15, wherein as a resistance value of the resistor is increased, losses at out-of-band frequencies of the amplified reflected signal increase, and losses at frequencies close to the resonant frequency of the amplified reflected signal decrease.

20. The oscillator of claim 15, wherein a resistance value of the resistor causes an insertion loss at a center frequency of the RF output signal to be less than insertion losses at frequencies other than the center frequency.

* * * * *